United States Patent
Kawai et al.

(10) Patent No.: US 11,129,321 B2
(45) Date of Patent: Sep. 21, 2021

(54) MOVEMENT ERROR DETECTION APPARATUS OF MOUNTING HEAD, AND COMPONENT MOUNTING APPARATUS

(71) Applicant: YAMAHA HATSUDOKI KABUSHIKI KAISHA, Iwata (JP)

(72) Inventors: Tarou Kawai, Shizuoka (JP); Ryousuke Nakamura, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 419 days.

(21) Appl. No.: 16/068,075

(22) PCT Filed: Jan. 8, 2016

(86) PCT No.: PCT/JP2016/050582
§ 371 (c)(1),
(2) Date: Jul. 3, 2018

(87) PCT Pub. No.: WO2017/119141
PCT Pub. Date: Jul. 13, 2017

(65) Prior Publication Data
US 2020/0029478 A1    Jan. 23, 2020

(51) Int. Cl.
*H05K 13/08* (2006.01)

(52) U.S. Cl.
CPC ......... *H05K 13/089* (2018.08); *H05K 13/081* (2018.08)

(58) Field of Classification Search
CPC .................. H05K 13/089; H05K 13/081
See application file for complete search history.

(56) References Cited

U.S. PATENT DOCUMENTS

| 6,538,425 B1* | 3/2003 | Kawada ............... H05K 13/089 |
| | | 324/750.22 |
| 2005/0210667 A1* | 9/2005 | Yakiyama ............ H05K 13/089 |
| | | 29/740 |
| 2010/0220183 A1 | 9/2010 | Yoro et al. |

FOREIGN PATENT DOCUMENTS

| CN | 101689512 A | 3/2010 |
| JP | H08-018289 A | 1/1996 |

(Continued)

OTHER PUBLICATIONS

An Office Action mailed by The State Intellectual Property Office of the People's Republic of China dated Jun. 5, 2019, which corresponds to Chinese Patent Application No. 201680073443.0 and is related to U.S. Appl. No. 16/068,075.

(Continued)

*Primary Examiner* — Livius R. Cazan

(74) *Attorney, Agent, or Firm* — Studebaker & Brackett PC

(57) ABSTRACT

A movement error detection apparatus includes a plurality of marks including a fifth mark (movable region inside mark) arranged in a movable region of a movable conveyor and first to fourth marks (movable region outside marks) arranged outside the movable region of the movable conveyor; a substrate recognition camera (imaging device to move together with a mounting head to image the first to fifth marks; and a projection device (auxiliary device) to assist an imaging. The first to fourth marks are arranged on a horizontal reference plane including a substrate, and the fifth mark is arranged at a position which is lower than the horizontal reference plane and at which the movable conveyor is not interfered. The projection device absorbs a height difference between the fifth mark and the horizontal reference plane to assist the substrate recognition camera in picking up a focused image of the fifth mark.

6 Claims, 12 Drawing Sheets

(56) References Cited

FOREIGN PATENT DOCUMENTS

| | | |
|---|---|---|
| JP | 3253218 B2 | 2/2002 |
| JP | 2005-197564 A | 7/2005 |
| JP | 2009-010176 A | 1/2009 |
| JP | 4343710 B2 | 10/2009 |
| JP | 5495260 B2 | 5/2014 |

OTHER PUBLICATIONS

International Search Report issued in PCT/JP2016/050582; dated Apr. 12, 2016.

* cited by examiner

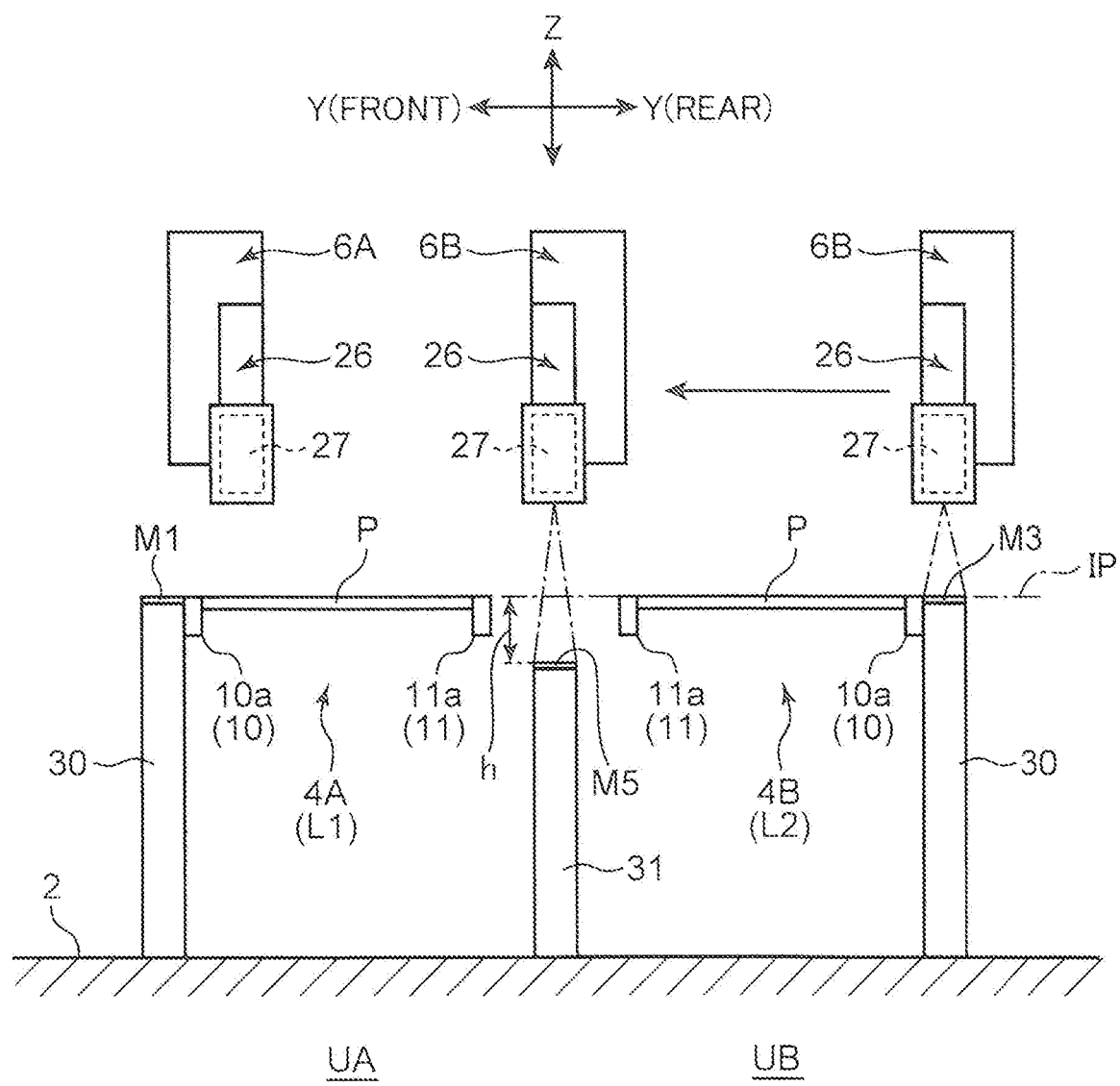

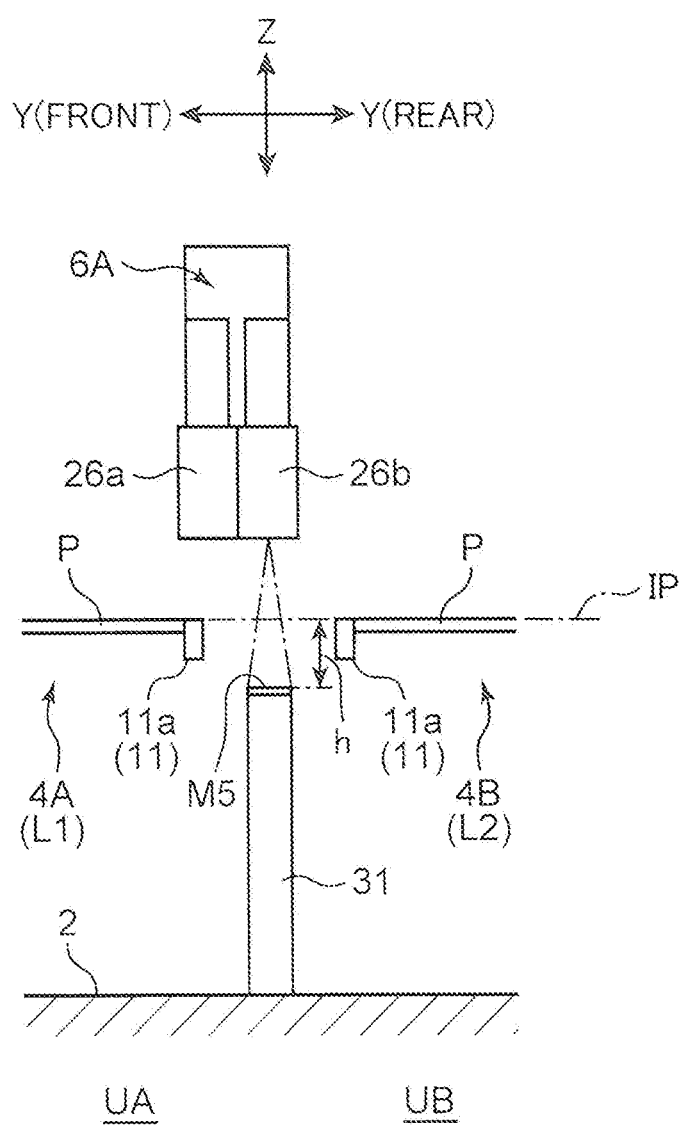

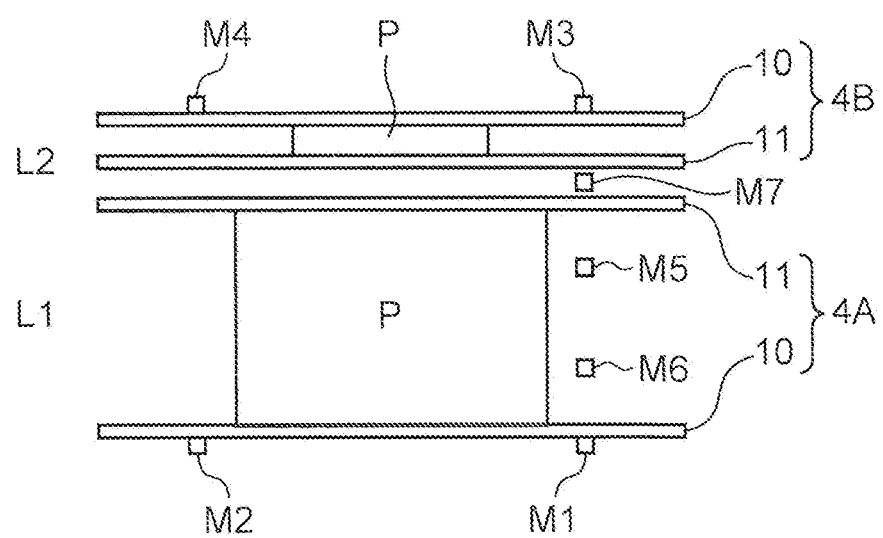

MOVEMENT ERROR DETECTION APPARATUS OF MOUNTING HEAD, AND COMPONENT MOUNTING APPARATUS

CROSS-REFERENCE TO RELATED APPLICATION

This application is a National Stage of International Patent Application No. PCT/JP2016/050582, filed Jan. 8, 2016, the entire content of which is incorporated herein by reference.

BACKGROUND

Technical Field

The present disclosure relates to a movement error detection apparatus of a mounting head, the movement error detection apparatus being incorporated into a component mounting apparatus for correcting a movement error of a mounting head caused by thermal deformation of a drive system, and to a component mounting apparatus including the movement error detection apparatus.

Background Art

A conventional component mounting apparatus includes a drive system which causes a mounting head to horizontally move, in which successive mounting operation causes the drive system to have thermal deformation due to heating thereof. Such thermal deformation causes deviation between a mounting head and a component of a component supply portion or a substrate, which is one factor of reduction in mounting precision. Under these circumstances, in order to solve the problem, a camera for recognizing a substrate, the camera moving together with a mounting head, is used to image and recognize a plurality of marks provided in a movable region of the mounting head, detect a change of a position of each of the marks as a movement error of the mounting head due to thermal deformation of a drive system, and correct a target loading position of a component on the basis of the movement error.

For example, Japanese Patent No. 3253218 discloses a technique of correcting a target loading position of a component on the basis of an imaging result obtained by imaging each position of marks, the marks being provided in proximity to a pair of conveyors for conveying a substrate, the pair being composed of a fixed conveyor and a movable conveyor and the marks including a pair of marks aligned in an X direction along the fixed conveyor and a pair of marks aligned in a Y direction. In this technique, in order to avoid interference with the movable conveyor, the pair of marks in the Y direction is provided outside a movable region of the movable conveyor. Therefore, it is expected that a substrate with a small size will cause a position of a mark and a position of an actual substrate to be largely spaced apart from each other (cause a correction area to be larger than a size of a substrate) to make it difficult to ensure correction precision.

On the other hand, Japanese Patent No. 5495260 discloses a technique of correcting a target loading position of a component on the basis of an imaging result obtained by imaging a pair of marks provided on a pair of conveyors for conveying a substrate, the pair of conveyors including a fixed conveyor and a movable conveyor and the paired marks being deviated from each other in a direction along the conveyor (an X direction). According to the technique, because the marks move together with the movable conveyor, such problem as described in Japanese Patent No. 3253218 is solved. However, since a position of each of the marks itself involves a movement error, it is difficult to ensure correction precision.

SUMMARY

An object of the present disclosure is to detect a movement error of a mounting head caused by thermal deformation of a drive system with high precision while reducing effects by a substrate size.

Thus, the present disclosure provides a movement error detection apparatus of a mounting head to be applied to a component mounting apparatus equipped with a substrate conveyance device including a fixed conveyor extending in a first direction and a movable conveyor that is movable in a second direction orthogonal to the first direction with respect to the fixed conveyor, and equipped with a mounting head to mount a component on a substrate conveyed by the substrate conveyance device to a predetermined work position. The movement error detection apparatus of a mounting head including a plurality of marks includes a movable-region-inside-mark arranged in a movable region of the movable conveyor and a movable-region-outside-mark arranged outside the movable region of the movable conveyor, an imaging device to move together with the mounting head to image the plurality of marks, and an auxiliary device to assist an imaging, in which the movable-region-outside-mark is arranged on a horizontal reference plane including an upper face of the substrate arranged at the work position. The movable-region-inside-mark is arranged at a position which is lower than the horizontal reference plane and at which the movable conveyor is not interfered, and the auxiliary device absorbs a height difference between the movable-region-inside-mark and the horizontal reference plane to assist the imaging device in picking up a focused image of the movable-region-inside-mark.

BRIEF DESCRIPTION OF THE DRAWINGS

FIG. 6 is a side view of a component mounting apparatus according to a second embodiment of the present disclosure;

FIG. 7 is a side view of a component mounting apparatus according to a third embodiment of the present disclosure;

FIG. 8B is a plan schematic view of first and second substrate conveyance devices in the component mounting apparatus shown in FIG. 8A in a single mode;

DETAILED DESCRIPTION

In the following, a first embodiment of the present disclosure will be described with reference to accompanying drawings.

[Configuration of Component Mounting Apparatus]

Figure 1:
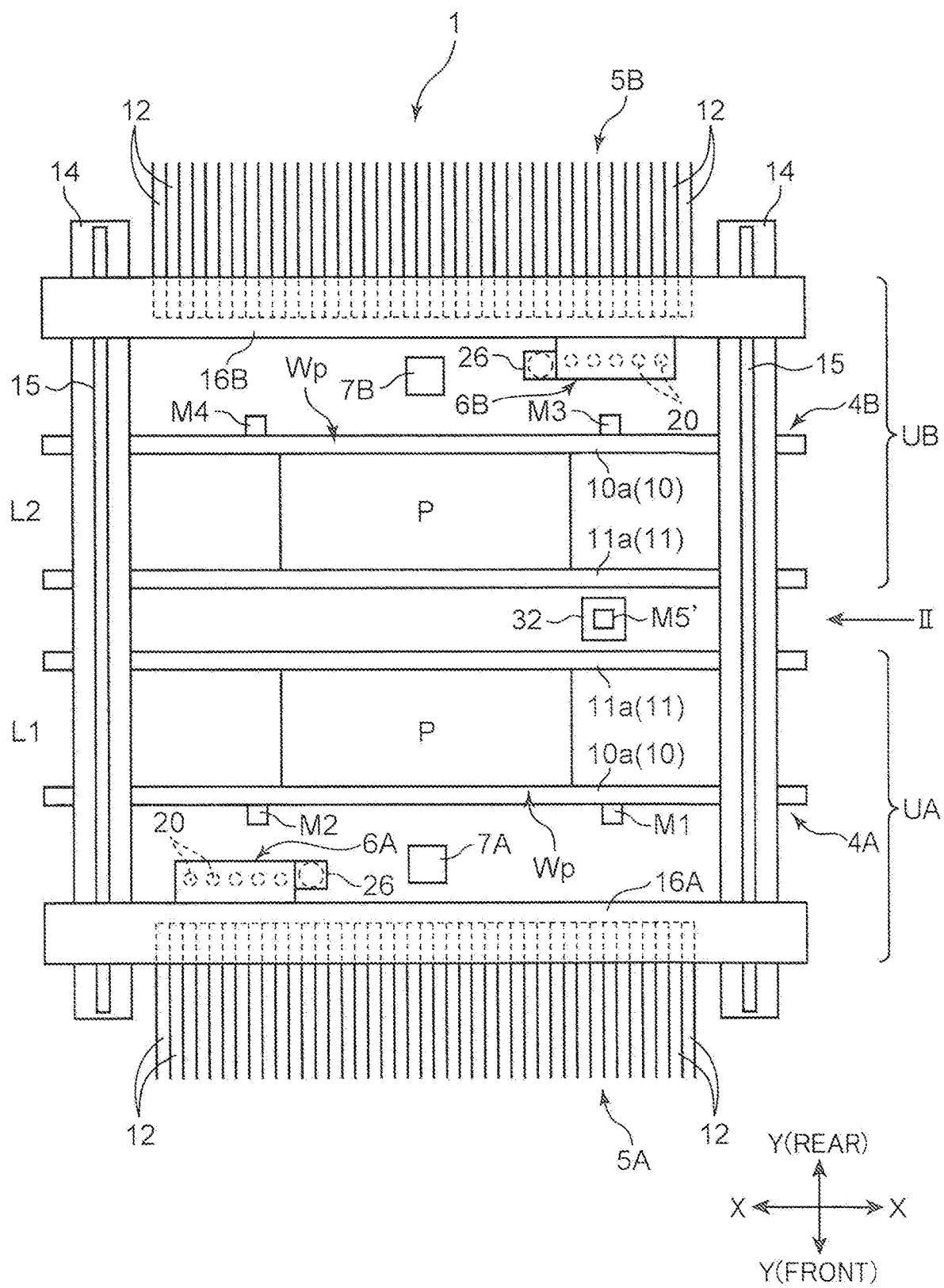
FIG. 1 is a plan schematic view of a component mounting apparatus (a component mounting apparatus to which a movement error detection apparatus of a mounting head of the present disclosure is applied) according to a first embodiment of the present disclosure.

A component mounting apparatus 1 shown in FIG. 1 employs a dual lane system and includes first and second mounting units UA and UB. The first and second mounting units UA and UB are provided for two lanes L1 and L2 (first lane L1, second lane L2) embodied on a base 2 having a rectangular structure (see FIG. 2), respectively, by substrate conveyance devices 4A and 4B which will be described later. In the following description, a horizontal direction parallel to the lanes L1 and L2 is set to be an X direction, a horizontal direction orthogonal to the X direction is set to be a Y direction, and a vertical direction is set to be a Z direction. One end side in the Y direction (underside of FIG. 1) is set to be a front side. When simply referred to as an upstream side and a downstream side, a conveyance direction of a substrate P to be described later is used as a reference. In this example, the X direction corresponds to a first direction of the present disclosure and the Y direction corresponds to a second direction of the present disclosure.

As shown in FIG. 1, the component mounting apparatus 1 includes the first mounting unit UA on a front side thereof and the second mounting unit UB on a rear side thereof. The first and second mounting units UA and UB are not only schematically symmetrical in a front-rear direction but also common in a basic configuration.

The first mounting unit UA includes the first substrate conveyance device 4A constituting the first lane L1 as a conveyance path of the substrate P such as a printed wiring board, a first component supply portion 5A, a first head unit 6A for mounting a component, a head unit drive mechanism which drives the first head unit 6A, and a first component recognition camera 7A.

The substrate conveyance device 4A includes a pair of belt-type conveyors 10 and 11 each extending in parallel to each other in the X direction (the first direction), and a conveyor drive mechanism which synchronously drives these conveyors 10 and 11 with a servo motor as a drive source. The substrate conveyance device 4A receives the substrate P from the right side in the figure to convey the substrate P to a predetermined work position Wp (a position of the substrate P shown in the figure), and holds the substrate P by a substrate holding device (not shown) which has a push-up pin or the like. Then, after mounting work, the substrate P is carried out to the left side in the figure.

Of the pair of conveyors 10 and 11, the conveyor 10 on the front side is a fixed conveyor which is fixed to the base 2 (hereinafter, appropriately referred to as the fixed conveyor 10) and the conveyor 11 on the rear side is a movable conveyor which is movable in the Y direction (the second direction) with respect to the fixed conveyor 10 (hereinafter, appropriately referred to as the movable conveyor 11). The substrate conveyance device 4A further includes a rail fixed to the base 2 and extending in the Y direction and a conveyor width variable mechanism which moves the movable conveyor 11 along the rail with the servo motor as the drive source. This configuration enables the substrate conveyance device 4A to change an interval between the conveyors 10 and 11 according to a size of the substrate P.

The conveyors 10 and 11 respectively have conveyor main bodies 10a and 11a extending in the X direction and a pair of leg portions (not shown) extending below at different positions in a longitudinal direction of the conveyor main bodies 10a and 11a. The leg portions of the fixed conveyor 10 are fixed to the base 2 and the leg portions of the movable conveyor 11 are movably supported on the rail.

The component supply portion 5A is arranged forward of the substrate conveyance device 4A. In the component supply portion 5A, a plurality of tape feeders 12 for supplying components with a tape as a carrier is arranged in parallel to each other along the substrate conveyance device 4A. These tape feeders 12 include a reel around which a tape housing and holding a small-piece chip component such as an IC, a transistor, and a capacitor is wound, and which supplies a component to a predetermined take-out position while intermittently feeding the tape from the reel.

The first head unit 6A takes out a component from the component supply portion 5A to convey the component onto the substrate P and load (mount) the component on the substrate P. The first head unit 6A is movable by the head unit drive mechanism in the X direction and the Y direction within a certain region. The head unit drive mechanism includes a pair of fixed rails 15 respectively fixed to a pair of elevated frames 14 provided at both ends in the X direction on the base 2 and extending in parallel to each other in the Y direction, a supporting member 16 supported by these fixed rails 15 to extend in the X direction, and a screw feeding mechanism which causes the supporting member 16 to move in the Y direction with an Y-axis servo motor 17 (see FIG. 3) as a drive source. Additionally, the head unit drive mechanism includes a fixed rail fixed by the supporting member 16 to movably support the first head unit 6A in the X direction, and a screw feeding mechanism which causes the first head unit 6A to move with an X-axis servo motor 18 (see FIG. 3) as a drive source. In other words, the head unit drive mechanism causes the first head unit 6A to move in the X direction by the drive of the X-axis servo motor 18 and causes the supporting member 16 to move in the Y direction by the drive of the Y-axis servo motor 17. As a result, the first head unit 6A moves in the X and Y directions within a certain region.

The first head unit 6A includes a plurality of mounting heads 20 each equipped with a nozzle for sucking a component, a head lifting mechanism which causes the mounting heads 20 to go up and down (to move in the Z direction) with a Z-axis servo motor 22 (see FIG. 3) as a drive source, and a head rotation mechanism which causes the mounting heads 20 to rotate around a center axis thereof with an R-axis servo motor 24 (see FIG. 3) as a drive source. Each nozzle of the mounting heads 20, which is connected to a negative pressure generation device, sucks a component by a negative pressure supplied from the negative pressure generation device.

The first head unit 6A is mounted with a substrate recognition camera 26 (corresponding to an imaging device of the present disclosure). The substrate recognition camera 26 moves together with the first head unit 6A to image a fiducial mark, not shown, (a mark for recognizing a substrate) which is attached to the substrate P, as well as imaging marks M1 to M5 to be described later which are for detecting movement errors of the head units 6A and 6B. The substrate recognition camera 26 includes a camera main body including an area sensor such as a CCD and an optical system and arranged downward, and an illumination device. The component mounting apparatus 1 recognizes a position of the substrate P on the basis of an image of a fiducial mark imaged by the substrate recognition camera 26, as well as correcting a position of a component mounted by the first head unit 6A on the basis of images of the marks M1 to M5 as will be described in detail later.

On the other hand, the first component recognition camera 7A, which images a component sucked by the mounting heads 20 before mounting, is fixed on the base 2. The first component recognition camera 7A includes a camera main body including a line sensor such as a CCD and an optical system and arranged upward on the base 2, and an illumination device. The component mounting apparatus 1 recognizes a suction state of a component by the mounting heads 20 on the basis of an image of the component picked up by the first component recognition camera 7A.

The foregoing is the configuration of the first mounting unit UA. The second mounting unit UB includes the second substrate conveyance device 4B constituting the second lane L2 as a conveyance path of the substrate P, a second component supply portion 5B, the second head unit 6B for mounting a component, a head unit drive mechanism which drives the second head unit 6B, and a second component recognition camera 7B. The second substrate conveyance device 4B and the like of the second mounting unit UB have a structure schematically symmetrical in the front-rear direction with respect to the first substrate conveyance device 4A and the like of the first mounting unit UA.

Figure 4A:
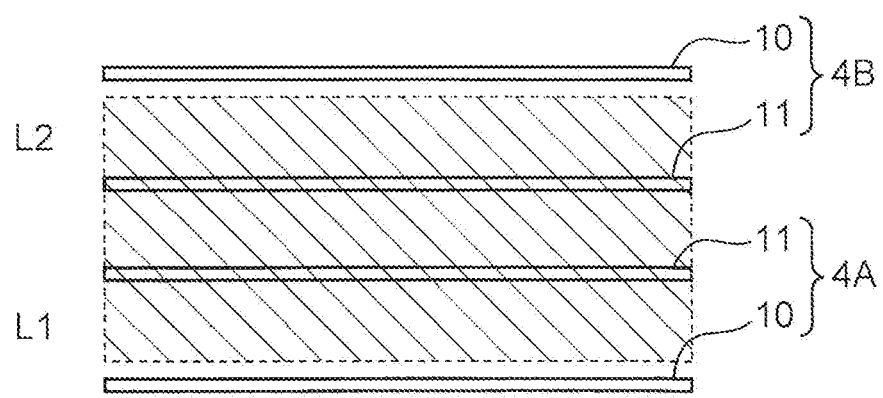
FIG. 4A is a plan schematic view of first and second substrate conveyance devices in which a movable region of a movable conveyor is shown.

Specifically, similarly to the first substrate conveyance device 4A, the second substrate conveyance device 4B has the fixed conveyor 10 and the movable conveyor 11, the fixed conveyor 10 being positioned on the rear side and the movable conveyor 11 being positioned on the front side. The movable conveyors 11 of the substrate conveyance devices 4A and 4B are each supported by the above common rail which extends in the Y direction and are movable in a region indicated by slant lines in FIG. 4A, that is, are movable within a region between both the fixed conveyors 10 as a movable region. This enables the movable conveyors 11 of the substrate conveyance devices 4A and 4B to be movable from a state where the movable conveyor 11 of the second substrate conveyance device 4B is arranged at a position closest to the fixed conveyor 10 and the movable conveyor 11 of the first substrate conveyance device 4A is arranged at a position closest to the movable conveyor 11 of the second substrate conveyance device 4B to a state where the movable conveyor 11 of the first substrate conveyance device 4A is arranged at a position closest to the fixed conveyor 10 and the movable conveyor 11 of the second substrate conveyance device 4B is arranged at a position closest to the movable conveyor 11 of the first substrate conveyance device 4A as shown in, for example, FIG. 4B.

The second head unit 6B is common to the first head unit 6A in being supported by the supporting member 16. However, while the first head unit 6A is arranged on the rear side of the supporting member 16, the second head unit 6B is arranged on the front side of the supporting member 16. In this manner, the first head unit 6A and the second head unit 6B are provided to face to each other in the front-rear direction. A configuration of the head unit drive mechanism which drives the second head unit 6B is basically common to a configuration of the head unit drive mechanism which drives the first head unit 6A. Each supporting member 16 of the head units 6A and 6B is supported by the common fixed rails 15 as shown in FIG. 1. This enables the first head unit 6A to move onto the substrate P of the second lane L2 or conversely enables the second head unit 6B to move onto the substrate P of the first lane L1.

Additionally, while the first component recognition camera 7A is arranged between the first substrate conveyance device 4A and the first component supply portion 5A, the second component recognition camera 7B is arranged between the second substrate conveyance device 4B and the second component supply portion 5B.

Figure 5:
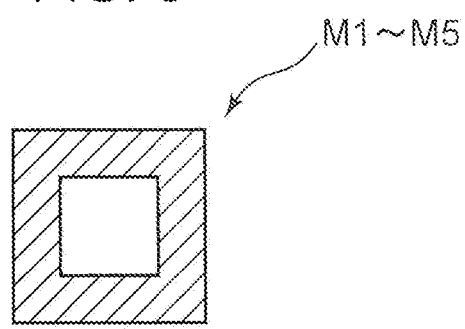
FIG. 5 is a plan view of a mark.

The first to fifth marks M1 to M5 for correcting a movement error of each of the head units 6A and 6B caused by thermal deformation of the head unit drive mechanism are provided on the periphery of the first substrate conveyance device 4A and the second substrate conveyance device 4B. In other words, when the head units 6A and 6B are driven for a long period of time, a screw shaft of the screw feeding mechanism and the elevated frames 14 thermally deform (thermally expand) in a longitudinal direction to generate an error in an amount of movement of the head units 6A and 6B (the mounting heads 20). Therefore, the component mounting apparatus 1 is provided with the rectangular marks M1 to M5 with voids as shown in, for example, FIG. 5, and the marks M1 to M5 are imaged by the above substrate recognition camera 26 of each of the head units 6A and 6B to detect movement errors of the head units 6A and 6B on the basis of the image.

Figure 2:
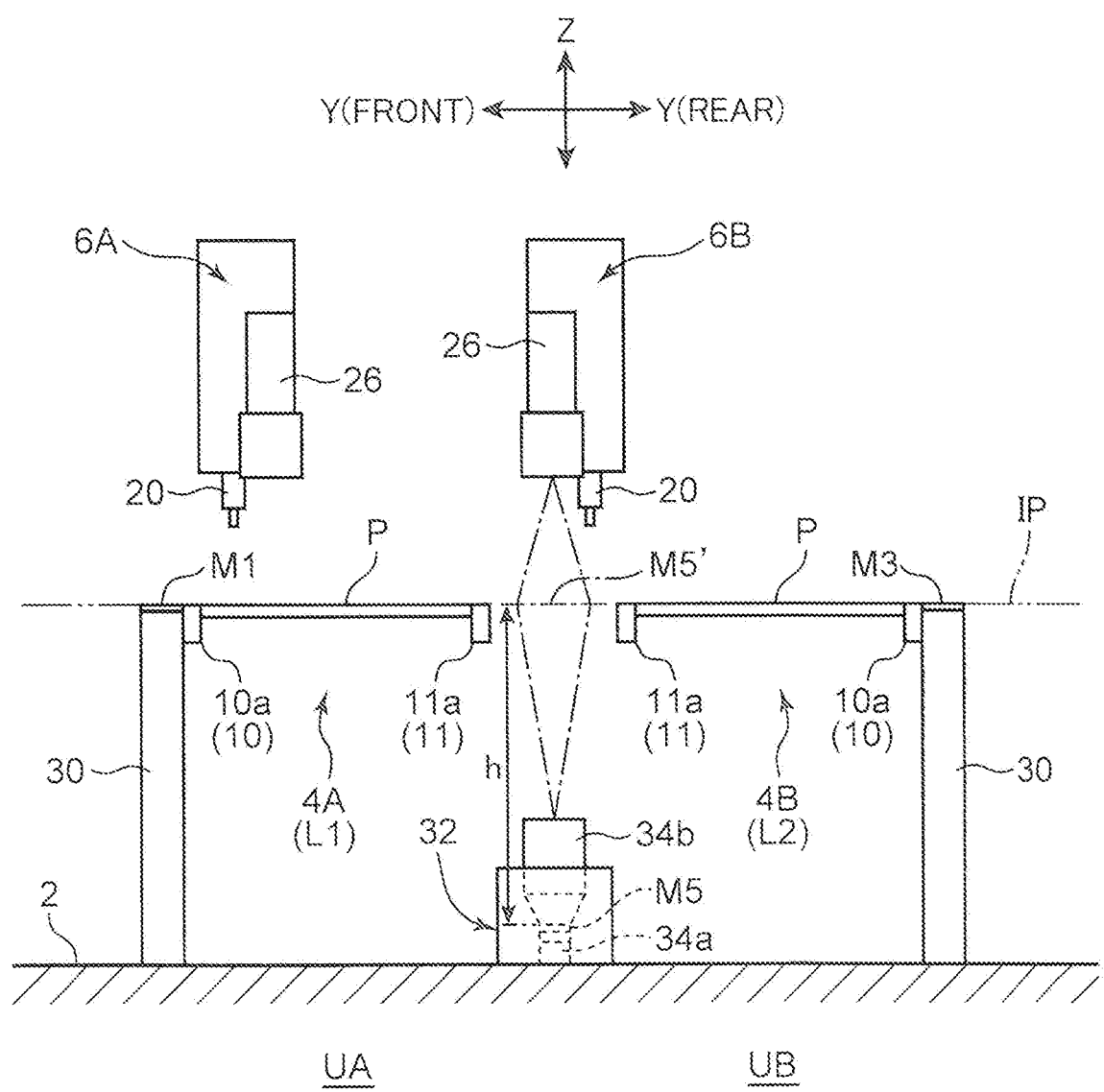
FIG. 2 is a side view of the component mounting apparatus (a view seen from an arrow in an II direction in FIG. 1)

A specific arrangement of each of the marks M1 to M5 is as follows. First, the first and second marks M1 and M2 are provided in order from the upstream side along the fixed conveyor 10 of the first substrate conveyance device 4A, and the third and fourth marks M3 and M4 are provided in order from the upstream side along the fixed conveyor 10 of the second substrate conveyance device 4B. As shown in FIGS. 1 and 2, the first and second marks M1 and M2 are provided on an upper end surface of a support 30 which is fixed on the base 2 along a front face of the fixed conveyor 10, and the third and fourth marks M3 and M4 are provided on the upper end surface of the support 30 which is fixed on the base 2 along a rear face of the fixed conveyor 10. The first and third marks M1 and M3 are aligned in the Y direction at positions upstream the work position Wp and the second and fourth marks M2 and M4 are aligned in the Y direction at a position downstream of the work position Wp.

The first to fourth marks M1 to M4 are made of, for example, engraved plates, stickers, or the like fixed to the support 30 and provided at positions of the heights identical with each other. Specifically, the marks are provided at the height identical with that of the substrate P held at the work position Wp by the substrate holding device, that is, the marks are provided to be positioned within a reference plane IP which is a virtual horizontal plane including an upper face of the substrate P as shown in FIG. 2. These first to fourth marks M1 to M4 are positioned outside the fixed conveyors 10 of the lanes L1 and L2 (i.e. outside the movable region of the movable conveyor 11) and accordingly, the first to fourth marks M1 to M4 correspond to movable-region-outside-marks in the present disclosure.

The fifth mark M5 is provided at a middle position between the first mark M1 and the third mark M3 in the Y direction. The fifth mark M5 (corresponding to a movable-region-inside-mark in the present disclosure) is provided in a projection device 32 (corresponding to an auxiliary device in the present disclosure) fixed on the base 2. The fifth mark M5 is made of, for example, a resin film, and the projection device 32 includes an illumination portion 34a and an optical system 34b, the illumination portion 34a being configured to radiate illumination light to the fifth mark M5 from a back thereof (from the underside) and the optical system 34b being configured to form a projected image M5' (focused image) on the reference plane IP. In other words, the substrate recognition camera 26 of each of the head units 6A and 6B has a focal distance set to be capable of imaging a fiducial mark on the substrate P arranged at the work position, and as shown in FIG. 2, when the substrate recognition camera 26 is arranged above the projection device 32, it becomes possible to image the projected image M5' of the fifth mark M5 by the substrate recognition camera 26.

The projection device 32 is arranged at a position which is lower than the conveyor main body 11a of the movable conveyor 11 and which is arranged out, in the X direction, of a movement path (a position of the rail) of the leg portion of the movable conveyor 11. Thus, the fifth mark M5 is arranged at a position which is lower than the reference plane IP and at which the movable conveyor 11 is not interfered, so that the projection device 32 absorbs the height difference h between the fifth mark M5 and the reference plane IP to enable the substrate recognition camera 26 to image a focused image of the fifth mark M5. In this manner, the component mounting apparatus 1 is configured to have the fifth mark M5 provided in the movable region of the movable conveyor 11 while avoiding interference with the movable conveyor 11. In the following description of the first embodiment, unless particularly required, the projected image M5' of the fifth mark M5 (the image picked up by the substrate recognition camera 26) formed on the reference plane IP will be referred to as the fifth mark M5 for convenience's sake.

Next, control systems of the component mounting apparatus 1 which control the first and second mounting units UA and UB will be described. The component mounting apparatus 1 has a control unit 40 which generally controls operation of the first and second mounting units UA and UB.

Figure 3:
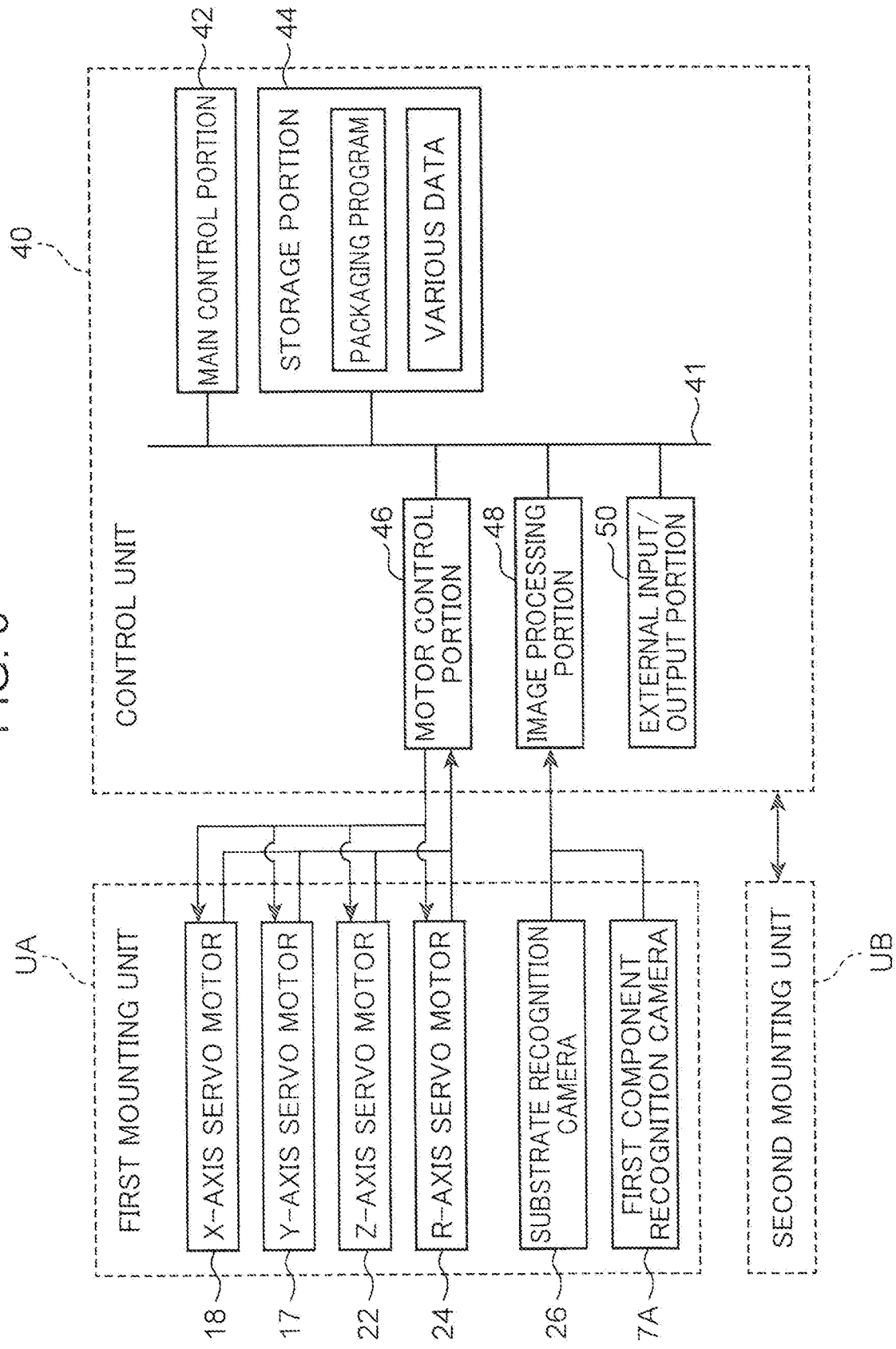
FIG. 3 is a block diagram showing a control system of the component mounting apparatus.

As shown in FIG. 3, the control unit 40 includes a main control portion 42 which generally controls operation of the component mounting apparatus 1, a storage portion 44 which stores a program and various data, a motor control portion 46 which controls drive of the servo motors 17, 18, 22, and 24 on X, Y, Z, and R axes, an image processing portion 48 which subjects data of an image picked up by the substrate recognition camera 26, and the first and second component recognition cameras 7A and 7B to predetermined processing, and an external input/output portion 50. The main control portion 42, which is a computer constituted by a CPU and a memory, is connected to the storage portion 44, the motor control portion 46, the image processing portion 48, and the external input/output portion 50 via a bus 41.

The main control portion 42 executes a mounting program necessary for mounting a component on the substrate P, as well as executing various arithmetic processing for the mounting. In particular, during component mounting operation by the head units 6A and 6B, the main control portion 42 executes operation of imaging the marks M1 to M5 by the substrate recognition camera 26 at predetermined timing and calculating a movement error of each of the head units 6A and 6B on the basis of the image data, as well as executing processing of correcting a target loading position of a component.

The storage portion 44 stores a mounting program to be executed by the main control portion 42 and various data necessary for executing a mounting program. The motor control portion 46 controls the motors 17, 18, 22, and 24 on the basis of a signal from an encoder contained in each of the motors 17, 18, 22, and 24 and information applied from the main control portion 42.

The image processing portion 48 is connected to the first component recognition camera 7A, the second component recognition camera 7B, and the substrate recognition camera 26 and takes in a signal indicative of an image from these cameras 7A, 7B, and 26, subjects the signal to predetermined image processing, and sends the image data to the main control portion 42. To the external input/output portion 50, various sensors provided in the mounting units UA and UB are connected as input elements, and the projection device 32 and the like are connected as output elements.

In this example, the first to fifth marks M1 to M5, the substrate recognition camera 26, and the projection device 32 correspond to a movement error detection apparatus of a mounting head of the present disclosure.

[Operation of Component Mounting Apparatus]

Schematically in the component mounting apparatus 1, a dual mode in which the first mounting unit UA and the second mounting unit UB individually mount a component on the substrate P and a single mode in which the first mounting unit UA and the second mounting unit UB mount a component on the substrate P in cooperation with each other are selectively executed.

In the dual mode, a component is mounted on the substrate P arranged at the work position Wp of the first lane L1 by the first head unit 6A, and a component is mounted on the substrate P arranged at the work position Wp of the second lane L2 by the second head unit 6B as shown in, for example, FIG. 1. In other words, while the first head unit 6A sucks the component from the tape feeders 12 of the first component supply portion 5A to mount the component on the substrate P of the first lane L1, the second head unit 6B sucks the component from the tape feeders 12 of the second component supply portion 5B to mount the component on the substrate P of the second lane L2. In this case, after the component suction, the first head unit 6A passes above the first component recognition camera 7A and the second head unit 6B passes above the second component recognition camera 7B, resulting in imaging the sucked component to recognize a state of the component sucked by the mounting heads 20. Then, a target loading position of the component is corrected on the basis of the state of the component sucked by the mounting heads 20 and a correction value for correcting movement errors of the head units 6A and 6B caused by thermal deformation of the head unit drive mechanism, thereby controlling the head units 6A and 6B on the basis of the target loading position.

The above correction value is obtained for each of the head units 6A and 6B on the basis of images of three marks among the marks M1 to M5, the three marks being aligned at right angles when connected by a straight line and being imaged by the substrate recognition camera 26. Specifically, a correction value of the first head unit 6A is obtained on the basis of the first, second, and fifth marks M1, M2, and M5, and a correction value of the second head unit 6B is obtained on the basis of the third, fourth, and fifth marks M3, M4, and M5. In other words, correction values of the first head unit 6A in the X and Y directions are obtained on the basis of positions of images of the first, second, and fifth marks M1, M2, and M5, and correction values of the second head unit 6B in the X and Y directions are obtained on the basis of positions of images of the third, fourth, and fifth marks M3, M4, and M5. A method of calculating a correction value for correcting a target loading position of this kind is a conventionally known technique (e.g. Japanese Patent No. 3253218 recited in the Background Art, etc.) and therefore no detailed description thereof will be made here.

During the substrate P mounting work, the first, second, and fifth marks M1, M2, and M5 are imaged by the substrate recognition camera 26 of the first head unit 6A, while the third, fourth, and fifth marks M3, M4, and M5 are imaged by the substrate recognition camera 26 of the second head unit 6B at predetermined timing set in advance, thereby updating the correction values of the head units 6A and 6B.

Figure 4B:
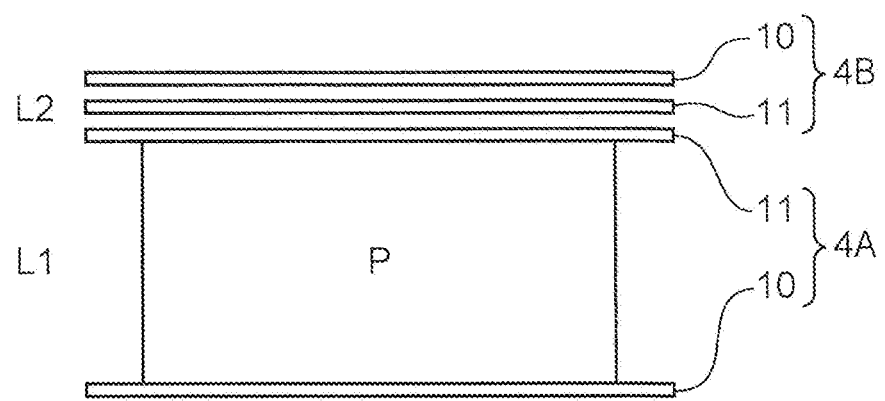
FIG. 4B is a plan schematic view of the first and second substrate conveyance devices in a single mode.

On the other hand, in the single mode, the substrate P is conveyed along one of the two lanes L1 and L2 to mount a component on the substrate P arranged at the work position Wp. For example, as shown in FIG. 4B, a component is mounted, by both the head units 6A and 6B, onto the substrate P arranged at the work position Wp of the first lane L1 extended to maximum. In other words, the first head unit 6A sucks the component from the tape feeders 12 of the first component supply portion 5A to mount the component on the substrate P, and the second head unit 6B sucks a component from the tape feeders 12 of the second component supply portion 5B to mount the component on the substrate P. In this case, in order to avoid collision between head units, for example, mounting of a component is executed alternately by the head units 6A and 6B at different times.

Also in the single mode, a target loading position of a component is corrected on the basis of the state of the component sucked by the mounting heads 20 and the correction value for correcting movement errors of the head units 6A and 6B, and the head units 6A and 6B are controlled on the basis of the target loading position.

In the single mode, a correction value of the first head unit 6A is obtained on the basis of the first to third marks M1 to M3, and a correction value of the second head unit 6B is obtained on the basis of the first, third, and fourth marks M1, M3, and M4. In other words, since a movement error of each of the head units 6A and 6B following thermal deformation of the head unit drive mechanism is increased in proportional to a movement distance thereof, the correction value is preferably a value according to a movement distance thereof, that is, according to a size of the substrate P. Therefore, in a case of mounting a component on the substrate P having a size in the Y direction larger than a distance between the first mark M1 to the fifth mark M5 in the single mode as shown in FIG. 4B, a correction value of the first head unit 6A is obtained on the basis of the first to third marks M1 to M3 without using the fifth mark M5, and a correction value of the second head unit 6B is obtained on the basis of the first, third, and fourth marks M1, M3, and M4.

[Function, Effects, Etc. Of Component Mounting Apparatus]

According to the component mounting apparatus 1 as described above in which the fifth mark M5 is provided in a movable region of the movable conveyor 11 in each of the substrate conveyance devices 4A and 4B, when the substrate P with a relatively small size is produced in the dual mode as described above (see FIG. 1), the first, second, and fifth marks M1, M2, and M5 (the third, fourth, and fifth marks M3, M4, and M5) are used to obtain correction values of the first head unit 6A (the second head unit 6B) in the X and Y directions. On the other hand, when the substrate P with a relatively large size is produced in the single mode (see FIG. 4B), the first, second, and third marks M1, M2, and M3 (the first, third, and fourth marks M1, M3, and M4) are used to obtain correction values of the first head unit 6A (the second head unit 6B) in the X and Y directions. It is therefore possible to suppress a position of a mark and a position of the actual substrate P from being largely spaced apart from each other (i.e. a correction area from becoming larger than the size of the substrate) when the substrate P has a small size. Additionally, a movement error of a mark is not involved as opposed to the case where a mark is fixed to the movable conveyor itself. Accordingly, the component mounting apparatus 1 enables detection of a movement error of each of the head units 6A and 6B caused by thermal deformation of the head unit drive mechanism (the drive system) with high precision while reducing effects by a size of the substrate P. This brings an advantage of accordingly increasing reliability of correction of a target loading position, thereby improving component mounting precision by the head units 6A and 6B.

In particular, the component mounting apparatus 1, which is configured such that with the projection device 32 fixed at a position at which the movable conveyor 11 is not interfered, the substrate recognition camera 26 picks up the projected image M5' (focused image) of the fifth mark M5 projected onto the reference plane IP by the projection device 32, has an advantage that while the fifth mark M5 is provided in the movable region of the movable conveyor 11, movement of the movable conveyor 11 is not be hindered at all.

Additionally, since the substrate recognition camera 26 for imaging the fifth mark M5 is allowed to use an imaged fiducial mark on the substrate P arranged at the work position Wp as it is, another advantage is brought about of imaging all the marks including the first to fifth marks M1 to M5 by the common substrate recognition camera 26 for recognizing the marks.

In this embodiment, while as an auxiliary device of the present disclosure, the projection device 32 is provided which projects the projected image M5' of the fifth mark M5 on the reference plane IP, the auxiliary device may be a device which forms a reflected image of the fifth mark M5 onto the reference plane IP.

Second Embodiment

FIG. 6 is a side view showing a component mounting apparatus 1 according to a second embodiment of the present disclosure. A configuration of the component mounting apparatus 1 according to the second embodiment differs from that of the first embodiment in the following points.

First, the component mounting apparatus 1 does not include the projection device 32 and in place thereof, a support 31 having the fifth mark M5 is provided at a middle position between the first mark M1 and the third mark M3. The support 31 is smaller in height than the conveyor main body 11a of the movable conveyor 11 and the fifth mark M5 is provided on an upper end surface of the support 31. Accordingly, the fifth mark M5 is provided at a position lower than the other marks M1 to M4. The support 31 is arranged out, in the X direction, of a movement path (a position of the rail) of the leg portion of the movable conveyor 11, thereby avoiding interference with the movable conveyor 11.

Additionally, the substrate recognition camera 26 of each of the head units 6A and 6B has a focal point switching mechanism 27 (corresponding to the auxiliary device of the present disclosure) with a stepping motor as a drive source. The focal point switching mechanism 27 switches a focal distance of the substrate recognition camera 26 between a first focal distance at which a fiducial mark of the substrate P and the first to fourth marks M1 to M4 are focused and a second focal distance at which the fifth mark M5 is focused. In other words, the focal point switching mechanism 27 absorbs the height difference h between the fifth mark M5 and the reference plane IP to enable the substrate recognition camera 26 to pick up a focused image of the fifth mark M5. The focal point switching mechanism 27 is connected to the external input/output portion 50 of the control unit 40 and is controlled by the main control portion 42. Specifically, only at the time of imaging of the fifth mark M5 by the substrate recognition camera 26, a focal distance of the substrate recognition camera 26 is controlled by the second focal distance and otherwise, the focal distance of the substrate recognition camera 26 is controlled by the first focal distance.

Basic operation of the component mounting apparatus 1 of the second embodiment is common to that of the component mounting apparatus 1 of the first embodiment except that a focal point of the substrate recognition camera 26 is switched according to a mark as an imaging target as described above.

The foregoing component mounting apparatus 1 of the second embodiment, in which the fifth mark M5 is provided in a movable region of the movable conveyor 11 in each of the substrate conveyance devices 4A and 4B similarly to that of the first embodiment, is allowed to have the function and effect similar to those of the first embodiment.

Third Embodiment

FIG. 7 is a side view showing a part of a component mounting apparatus 1 according to a third embodiment of the present disclosure.

The component mounting apparatus 1 of the third embodiment is a modification example of the second embodiment. Specifically, in the third embodiment, in place of the focal point switching mechanism 27 provided in the substrate recognition camera 26, each of the head units 6A and 6B is mounted with a first substrate recognition camera 26a whose focal distance is set with a fiducial mark on the substrate P or the first to fourth marks M1 to M4 as an imaging target, and a second substrate recognition camera 26b (corresponding to the auxiliary device of the present disclosure) whose focal distance is set with the fifth mark M5 as an imaging target. In other words, the second substrate recognition camera 26b absorbs the height difference h between the fifth mark M5 and the reference plane IP to pick up a focused image of the fifth mark M5.

In the component mounting apparatus 1 of the third embodiment, the head units 6A and 6B and the substrate recognition cameras 26a and 26b are controlled by the main control portion 42 such that the first substrate recognition camera 26a is used at the time of imaging a fiducial mark on the substrate P and the first to fourth marks M1 to M4, and the second substrate recognition camera 26b is used at the time of imaging the fifth mark M5. The remaining part of the basic operation of the component mounting apparatus 1 is common to the component mounting apparatuses 1 of the first and second embodiments.

The foregoing component mounting apparatus 1 of the third embodiment, in which the fifth mark M5 is provided in a movable region of the movable conveyor 11 in each of the substrate conveyance devices 4A and 4B similarly to the first and second embodiments, is allowed to have the function and effect similar to those of the first and second embodiments.

Other Modification Example

The above-described component mounting apparatuses 1 of the first to third embodiments are illustrative of a preferred embodiment of the component mounting apparatus 1 (the component mounting apparatus 1 to which the movement error detection apparatus of the present disclosure is applied) according to the present disclosure, and a specific configuration of the component mounting apparatus 1 or the movement error detection apparatus can be appropriately changed without departing from the gist of the present disclosure.

Figure 8A:
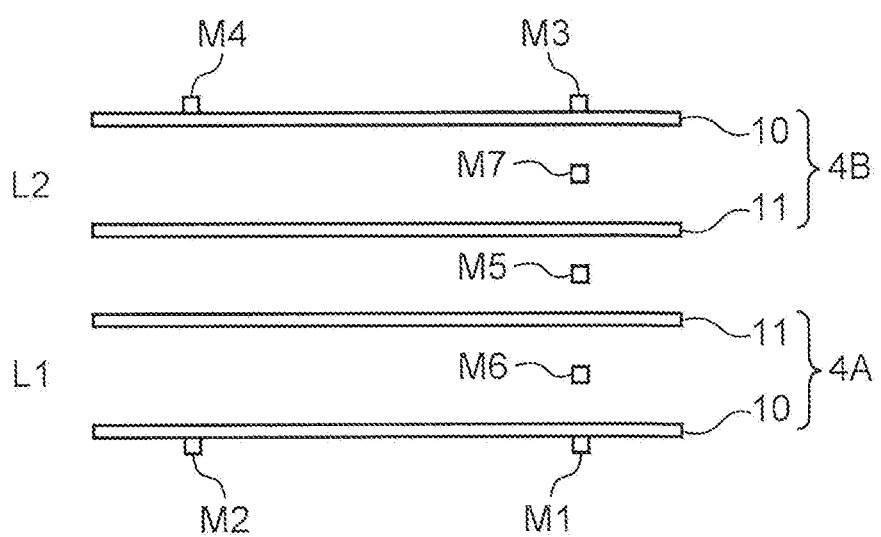
FIG. 8A is a plan schematic view showing a modification example of the component mounting apparatus.

For example, in the component mounting apparatus 1 of each embodiment, the fifth mark M5 is provided between the first mark M1 and the third mark M3. However, more marks may be provided. For example, a sixth mark M6 may be provided between the first mark M1 and the fifth mark M5 in a similar manner to that of the fifth mark M5, and a seventh mark M7 may be provided between the third mark M3 and the fifth mark M5 in a similar manner to that of the fifth mark M5 as shown in FIG. 8A. In this configuration, when large and small substrates P having different sizes are produced in the dual mode as shown in, for example, FIG. 8B, correction values in the X and Y directions of the first head unit 6A can be obtained on the basis of the first, second and seventh marks M1, M2, M7 and correction values in the X and Y directions of the second head unit 6B can be obtained on the basis of the third, fourth, and seventh marks M3, M4, M7, thereby enabling a correction value to be obtained using marks at intervals corresponding to the size of the substrate P produced in each of the lanes L1 and L2. Therefore, it is possible to further increase precision of mounting a component by the head units 6A and 6B.

Additionally, the component mounting apparatus 1 of each embodiment is a dual lane system component mounting apparatus. However, the component mounting apparatus 1 may be a single lane component mounting apparatus.

Figure 9A:
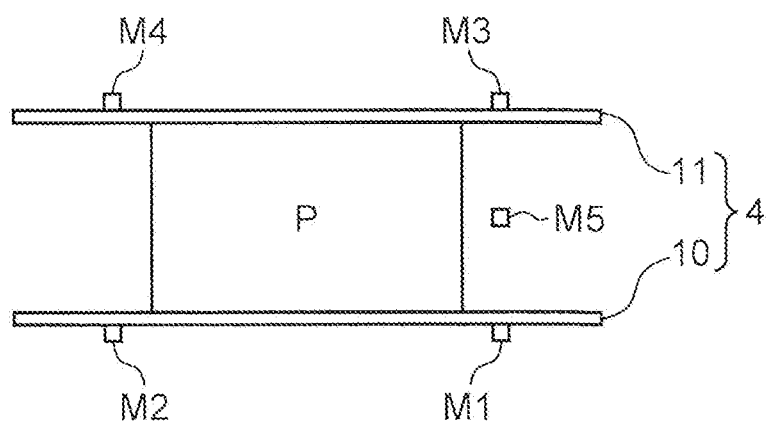
FIG. 9A is a plan schematic view of a single lane component mounting apparatus in which a positional relationship between a conveyor and a mark is shown.
Figure 9B:
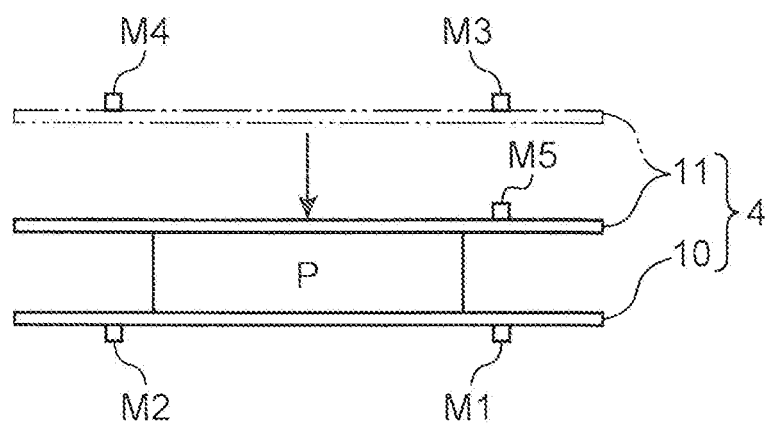
FIG. 9B is a plan schematic view showing a state of the conveyor when a small-sized substrate is conveyed in the component mounting apparatus shown in FIG. 9A.

In this case, it is only necessary that in a state where the conveyors 10 and 11 of a substrate conveyance device 4 are set at a maximum interval as shown in, for example, FIG. 9A, the first and second marks M1 and M2 are arranged along the fixed conveyor 10 and on the front side thereof, the third and fourth marks M3 and M4 are arranged along the movable conveyor 11 and on the rear side thereof, and the fifth mark M5 is arranged at a middle position between the first mark M1 and the third mark M3 in the Y direction. According to this configuration, at the time of production of a large-sized substrate P, correction values of the X and Y directions are obtained on the basis of the first, second, and third marks M1, M2, and M3 as shown in FIG. 9A, and at the time of production of a small-sized substrate P, correction values of the X and Y directions are obtained on the basis of the first, second, and fifth marks M1, M2, and M5 as shown in FIG. 9B. It is therefore possible to obtain a correction value using marks at an interval more corresponding to the size of the substrate P in the single lane component mounting apparatus 1.

The present disclosure described in the foregoing is summarized as follows.

In other words, the present disclosure provides a movement error detection apparatus of a mounting head to be applied to a component mounting apparatus equipped with a substrate conveyance device including a fixed conveyor extending in a first direction and a movable conveyor that is movable in a second direction orthogonal to the first direction with respect to the fixed conveyor, and equipped with a mounting head to mount a component on a substrate conveyed by the substrate conveyance device to a predetermined work position. The movement error detection apparatus of a mounting head including a plurality of marks including a movable-region-inside-mark arranged in a movable region of the movable conveyor and a movable-region-outside-mark arranged outside the movable region of the movable conveyor, an imaging device to move together with the mounting head to image the plurality of marks, and an auxiliary device to assist the imaging, in which the movable-region-outside-mark is arranged on a horizontal reference plane including an upper face of the substrate arranged at the work position. The movable-region-inside-mark is arranged at a position which is lower than the horizontal reference plane and at which the movable conveyor is not interfered, and the auxiliary device absorbs a height difference between the movable-region-inside-mark and the horizontal reference plane to assist the imaging device in picking up a focused image of the movable-region-inside-mark.

According to the configuration of the movement error detection apparatus, a mark (a movable-region-inside-mark) can be fixedly provided in a movable region of a movable conveyor while avoiding interference with the movable conveyor. It is therefore possible to suppress a position of a mark and a position of an actual substrate from being largely spaced apart from each other (a correction area from becoming larger than the size of the substrate) when the substrate has a small size while eliminating involvement of a movement error of a mark which occurs when a mark is fixed to the movable conveyor itself. This makes it possible to detect a movement error of a mounting head caused by thermal deformation of a drive system while reducing effects by a size of the substrate.

In this movement error detection apparatus, the auxiliary device includes an illumination portion which radiates illumination light to the movable-region-inside-mark, and an optical system which guides light from the movable-region-inside-mark to the reference plane to form an image of the movable-region-inside-mark on the reference plane, and the imaging device preferably picks up an image of a movable-region-inside-mark formed on the reference plane.

This configuration enables a mark (movable-region-inside-mark) to be provided substantially within a reference plane in a movable region of a movable conveyor while avoiding interference with the movable conveyor.

In this case, the auxiliary device may form a reflected image of a movable-region-inside-mark on the reference plane or alternatively form a projected image of a movable-region-inside-mark on the reference plane.

Additionally, in the above movement error detection apparatus, the auxiliary device may include a focal distance switching mechanism which switches a focal distance of the imaging device between a state where the movable-region-outside-mark is focused and a state where the movable-region-inside-mark is focused.

Also in this configuration of the movement error detection apparatus, while a mark (a movable-region-inside-mark) is arranged in a movable region of a movable conveyor, the movable-region-inside-mark and the movable-region-outside-mark can be imaged by a common imaging device.

In the above movement error detection apparatus, the imaging device may include a first imaging device focused on the movable-region-outside-mark and a second imaging device which is the auxiliary device focused on the movable-region-inside-mark.

In the configuration of the movement error detection apparatus, selective use of the first imaging device and the second imaging device enables imaging of a movable-region-inside-mark and a movable-region-outside-mark.

On the other hand, the component mounting apparatus of the present disclosure includes a substrate conveyance device including a fixed conveyor extending in a first direction and a movable conveyor that is movable in a second direction orthogonal to the first direction with respect to the fixed conveyor, a mounting head to mount a component on a substrate conveyed by the substrate conveyance device to a predetermined work position, and a movement error detection apparatus for detecting a movement error of the mounting head, the component mounting apparatus being one of the above-described movement error detection apparatuses.

The component mounting apparatus enables correction of a movement error of a mounting head caused by thermal deformation of a drive system with high precision, while reducing effects by a substrate size as described above, so that mounting precision of the component is increased accordingly.

What is claimed is:

1. A movement error detection apparatus for a component mounting apparatus comprising
   a substrate conveyance device including a fixed conveyor extending in a first direction and a movable conveyor which is movable in a second direction orthogonal to the first direction with respect to the fixed conveyor, and
   a mounting head to mount a component on a substrate conveyed by the substrate conveyance device to a predetermined work position,
   the movement error detection apparatus comprising:
   a plurality of marks including
      a movable-region-inside-mark arranged in a movable region of the movable conveyor and
      a movable-region-outside-mark arranged outside the movable region of the movable conveyor,
   an imager adapted to be attached to the mounting head and to move together with the mounting head to image the plurality of marks, and
   an auxiliary device to assist an imaging, wherein
   the movable-region-outside-mark is arranged on a horizontal reference plane extending along an upper face of the substrate arranged at the work position,
   the movable-region-inside-mark is arranged at a position which is lower than the horizontal reference plane and at which the movable conveyor is not in contact with the movable-region-inside-mark, and
   the auxiliary device absorbs a height difference between the movable-region-inside-mark and the horizontal reference plane to assist the imager in picking up a focused image of the movable-region-inside-mark.

2. The movement error detection apparatus according to claim 1, wherein
   the auxiliary device includes an illumination portion to radiate illumination light to the movable-region-inside-mark, and an optical system to guide light from the movable-region-inside-mark to the horizontal reference plane to form an image of the movable-region-inside-mark on the horizontal reference plane, and
   the imager picks up an image of the movable-region-inside-mark formed on the horizontal reference plane.

3. The movement error detection apparatus according to claim 2, wherein the auxiliary device forms a projected image of the movable-region-inside-mark on the horizontal reference plane.

4. The movement error detection apparatus according to claim 1, wherein the auxiliary device includes a focal distance switching mechanism to switch a focal distance of the imager between a state where the movable-region-outside-mark is focused and a state where the movable-region-inside-mark is focused.

5. The movement error detection apparatus according to claim 1, wherein the imager includes a first imager focused on the movable-region-outside-mark and the auxiliary device is a second imager focused on the movable-region-inside-mark.

6. A component mounting apparatus comprising:
- a substrate conveyance device including a fixed conveyor extending in a first direction and a movable conveyor that is movable in a second direction orthogonal to the first direction with respect to the fixed conveyor;
- a mounting head to mount a component on a substrate conveyed by the substrate conveyance device to a predetermined work position; and
- the movement error detection apparatus according to claim 1 for detecting a movement error of the mounting head.

* * * * *